United States Patent [19]

Infante

[11] 4,129,807
[45] Dec. 12, 1978

[54] CURRENT REGULATING CIRCUIT FOR MAGNETIC DEFLECTION SYSTEMS

[75] Inventor: Carlo Infante, Dallas, Tex.

[73] Assignee: Xerox Corporation, Stamford, Conn.

[21] Appl. No.: 732,686

[22] Filed: Oct. 15, 1976

[51] Int. Cl.² .................. H01J 29/70; H01J 29/72
[52] U.S. Cl. .................................... 315/387; 315/399
[58] Field of Search ............... 315/387, 389, 399, 408, 315/398

[56] References Cited

U.S. PATENT DOCUMENTS

| 3,609,219 | 9/1971 | Diehl ..................................... 315/387 |
| 3,947,723 | 3/1976 | Thompson .......................... 315/389 |
| 4,009,426 | 2/1977 | Böhringer ............................ 315/387 |

Primary Examiner—Theodore M. Blum

[57] ABSTRACT

The current in the deflection coil of a video display system is converted into a DC voltage and applied to a peak detector. Peak values of the DC voltages as stored by the peak detector are amplified and then compared with a reference voltage at the input of a comparator amplifier. The comparator amplifier provides an output as a base drive to a regulating transistor that has an emitter-collector junction in series with the deflection coil and an unregulated source of DC power.

20 Claims, 3 Drawing Figures

CURRENT REGULATING CIRCUIT FOR MAGNETIC DEFLECTION SYSTEMS

BACKGROUND OF THE INVENTION

This invention relates to a circuit for regulating the current through an inductor, and more particularly to a circuit for regulating the current in the deflection coil of an image display tube to maintain a fixed image width.

In an image reproduction system having a cathode ray tube the image width is controlled by a horizontal deflection coil functioning as an inductor in a circuit that produces, through the coil, a sawtooth waveform of current. This sawtooth waveform is centered plus and minus of zero to maintain the image centered on the cathode ray tube.

The classic circuit for generating a current having a sawtooth waveform includes, along with the inductor coil, an unregulated voltage source and a charging capacitor in series with the inductor. A damping diode is connected in parallel with capacitor and, in addition, a switching transistor is connected in series with the inductor and responsive to a periodically applied signal that establishes the frequency of the waveform.

For this classic circuit, the mathematical relationship for the current, $i_p$, in the inductor coil is as follows:

$$i_p = V_c t_{trace}/2L, \quad (1)$$

where
  $V_c$ is the voltage of the direct current source,
  $t_{trace}$ is the trace time, and
  $L$ is the inductance of the deflection coil.

From this mathematical expression, it will be clear that any variation due to changes in the $t_{trace}$, $V_c$ or $L$ will effect the deflection coil currents, and this in turn varies the size of the image display on the cathode ray tube. Specifically, the amplitude of the sawtooth waveform, and thus the deflection coil current, varies with each of the parameters of equation (1). Since the inductance of the deflection coil, $L$, can be maintained fairly constant, the waveform primarily varies with the level of the applied voltage, and the frequency of the sawtooth waveform, that is, $t_{trace}$.

Heretofore, whenever a change occurred in the voltage of the direct current source as applied to the deflection coil or the frequency of the waveform changed, a manual adjustment was required to return the image display to its original width. Considerable inconvenience results if everytime a change occurs someone must make a manual adjustment to correct the image width.

Various attempts have been made to eliminate the requirement for a manual adjustment when a change in image width occurred due to a change in current through the deflection coil. In one such prior art system, the high voltage generating circuit of the cathode ray tube is connected with a shunt regulator circuit in such a manner that the sum of the current flowing to the high voltage load circuit of the cathode ray tube and the current flowing through the shunt regulator circuit is maintained at a constant value. As a result, the horizontal output stage is operated continuously under a maximum load condition thereby adversely affecting the reliability of the display.

SUMMARY OF THE INVENTION

In accordance with the present invention, a current regulating circuit is provided that stabilizes the current through an inductor by regulating the voltage applied thereto. Further in accordance with the present invention, changes in the sweep current waveform at the deflection coil of a video display are minimized by regulating the applied voltage level. The present invention provides a circuit for regulating inductor current against changes in frequency of a switching signal and changes in voltage level of a power source.

In accordance with the present invention, a circuit for regulating the current through an inductor includes a sensor responsive to the current in the inductor and generating a DC voltage varying therewith. This DC voltage is applied to a peak detector that provides peak values of the DC voltage to a voltage comparator that also is connected to a reference voltage source. The voltage comparator generates a control voltage varying with the difference between the peak values of the DC voltage and the reference voltage. A control regulator connected between a power source and the inductor responds to the control voltage and regulates the current in the inductor in accordance with variations in the control voltage.

A more complete understanding of the invention and its advantages will be apparent from the specification and claims and from the accompanying drawings illustrative of the invention.

BRIEF DESCRIPTION OF THE DRAWINGS

Referring to the drawings.

DETAILED DESCRIPTION OF THE INVENTION

Figure 1:
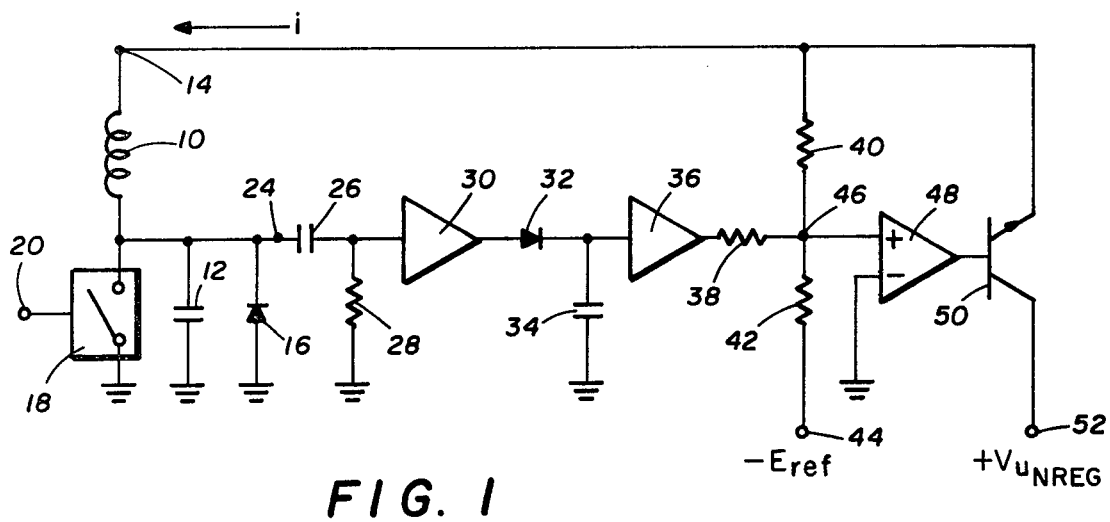
FIG. 1 is a schematic diagram of a circuit for regulating the current through the deflection coil of a cathode ray tube.

Referring to FIG. 1, there is shown a circuit for magnetically deflecting the scanning beam of a cathode ray tube wherein an inductor 10 functions as the deflection coil and is in series with a charging capacitor 12 forming a tank circuit connected between a voltage supply terminal 14 and ground. In parallel with the charging capacitor 12 is a damping diode 16 with both the charging capacitor and the damping diode in parallel with a scanning switch 18. Typically, the scanning switch 18 is a transistor controlled by scanning pulses applied to a control terminal 20, and it is the repetition rate of these pulses that establishes the trace time, $t_{trace}$, of equation (1).

Figure 2:
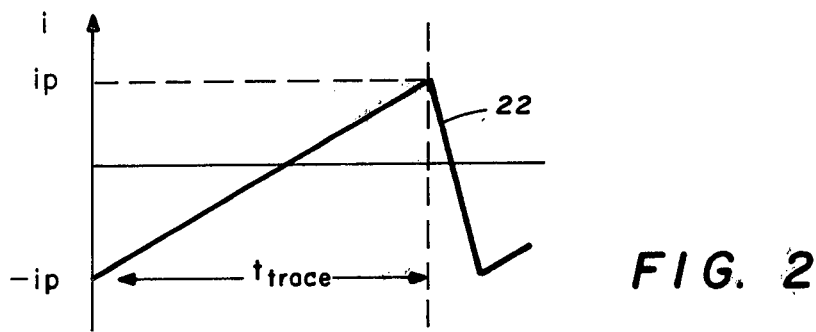
FIG. 2 is a graphic illustration of the current waveform generated in the deflection coil in the circuit of FIG. 1.

The system thus far described supplies a current having a sawtooth waveform 22, illustrated in FIG. 2, across the horizontal deflection coil or inductor 10 of the yoke assembly (not shown) comprising parts of an image reproduction device. The current in the deflection coil is a maximum ($i_p$) on the termination of a line scan and flows, at a rapidly decreasing rate, through the charging capacitor 12 at the initiation of a line scan return.

A signal applied to the terminal 20 turns on the scanning switch 18 for the duration of a scanning pulse. This closes a circuit connecting the deflection coil 10 to a DC voltage source at the terminal 14 and energy is transferred therefrom to the deflection coil thereby causing current to flow through the coil in the direction and reaching a maximum (ip) indicated by the positive going portion of the waveform 22 of FIG. 2. At this instant switch 18 is opened. With the opening of the scanning switch 18, the energy stored in the coil is transferred to the charging capacitor 12 causing current to again flow through the deflection coil in the direction indicated by the negative going portion of the waveform 22. The peak, or flyback, voltage produced on terminal 24 is given by:

$$V_f = i_p \sqrt{L/C} \qquad (2)$$

In accordance with this invention, the current producing the sawtooth waveform 22, which is utilized in the deflection 10 for horizontal scanning of an electron beam in a cathode ray tube, displays a constant peak amplitude independent of changes in the variables of equation (1). By maintaining a constant peak amplitude or magnitude for the deflection coil current the horizontal dimension of the image in a cathode ray tube is held fixed.

To maintain a constant peak-to-peak amplitude for the current of waveform 22, the voltage level applied to the terminal 14 is varied in accordance with the retrace voltage sensed at a terminal 24 connected to the deflection coil 10. An RC network having a small time constant and including a coupling capacitor 26 and a resistor 28 converts the current of the waveform 22 into a retrace voltage across the resistor 28. This retrace voltage is applied to the input of a buffer amplifier 30 that provides isolation of the regulating circuit of the present invention from the image scan circuit.

This output voltage from the amplifier 30 is applied to a peak detector consisting of a diode 32 and a capacitor 34 connected to ground.

The peak detector receives the output of the buffer amplifier 30, which is a voltage varying plus or minus of zero and related to the current through the deflection coil 10. As the name implies, the peak detector rectifies the output of the buffer amplifier 30 by means of the diode 32 and converts it into essentially a DC voltage for charging the capacitor 34. The charge on the capacitor 34 is thus a stored voltage representing the peak values of the flyback voltage and therefore proportional to the peak current in accordance with equation (2). These peak voltage values are applied to an input of a buffer amplifier 36 that produces an output through a resistor 38 for comparison with a reference voltage.

To generate the reference voltage, a resistor 40 is connected in series with a resistor 42 between the terminal 14 and a reference supply connected to a terminal 44. The reference supply generates an output voltage in any conventional manner, such as by a Zener diode network connected to an unregulated supply.

With the interconnection of the resistors 40 and 42 as shown, the voltage at a summing junction 46 varies directly with the difference between the voltages at the terminals 14 and 44. This voltage is compared with the output of the amplifier 36 through the resistor 38. The resulting voltage at the summing junction 46 is then applied to the noninverting input terminal of a control amplifier 48. The amplifier 48 generates a control voltage to a regulating transistor 50 having an emitter-collector junction connected between the terminal 14 and an unregulated DC voltage supply at a terminal 52.

Considering equation (1) above, the deflection coil current, $i_p$, varies directly with the voltage $V_c$ applied to the terminal 14. Assuming that the inductance L of the deflection coil 10 remains constant, then from equation (1) any variation in the frequency, that is, the trace time $t_{trace}$, will change the deflection coil current in a direct relationship. To maintain a fixed amplitude for the deflection coil current, and thus maintain the constant horizontal deflection width for a cathode ray tube display, the voltage, $V_c$, applied to the terminal 14 must vary inversely with the trace time.

From an analysis of the regulating circuit of FIG. 1 connected to terminals 14 and 24, a voltage developed across the charging capacitor 12 is coupled through the capacitor 26 to produce a voltage across the resistor 28 which is applied to the input of the buffer amplifier 30. At the output of the buffer amplifier 30 the peak detector, comprising the diode 32 and the capacitor 34, rectifies the waveform of FIG. 2 into essentially a DC voltage that is stored on the capacitor 34. This voltage as stored in the capacitor 34 is the peak value of the essentially DC voltage and is input to a buffer amplifier 36 that generates a voltage at the summing junction 46 for comparison with a reference voltage as established by resistors 40 and 42. This reference voltage is set at a value to produce a desired deflection coil current, and any variation thereof at the output of the amplifier 36 appears as an error signal to the input of the control amplifier 48. A control voltage now generated at the ouput of the amplifier 48 controls the conduction level of the regulating transistor 50 to adjust the voltage, $V_c$, see equation (1), applied to the terminal 14. Thus, any change in the peak current through the deflection coil 10 will appear as a change in the voltage stored in the capacitor 34 which produces an error signal at the summing junction 46 to control conduction of the regulating transistor 50. The feedback circuit of FIG. 1 thus regulates the deflection coil current by varying the applied voltage at the terminal 14.

Figure 3:
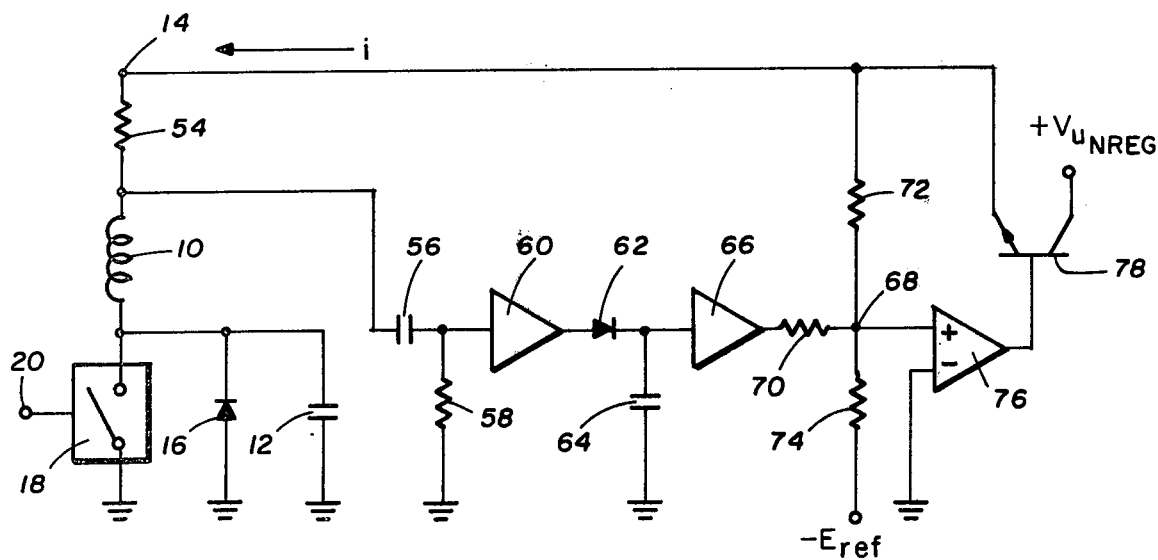
FIG. 3 is a schematic diagram of an alternate embodiment of a circuit for regulating the current through the deflection coil of a cathode ray tube.

Referring to FIG. 3, there is shown an alternate embodiment of the invention wherein the deflection coil 10 is in series with the charging capacitor 12 and also in series with a sensing resistor 54. As in the embodiment of the invention shown in FIG. 1, the switch 18 responds to a scanning pulse on a terminal 20 to control the current build up in the coil 10. The damping diode 16 is in parallel with the charging capacitor 12 to control the negative excursion of the deflection current below the zero axis line, as explained previously.

While the circuit of FIG. 1 responds to the retrace voltage to stabilize the deflection coil current against changes in input frequency, the embodiment of FIG. 3 stabilizes the actual deflection coil current by sensing this current through the resistor 54.

At the interconnection of the resistor 54 and the deflection coil 10, an RC network, comprising a capacitor 56 and a resistor 58, responds to the voltage developed across the resistor 54 to provide a voltage across the resistor 58 as an input to a buffer amplifier 60, again functioning as an isolation amplifier. Because the circuit of FIG. 3 responds continuously to the voltage developed across the resistor 54, the time constant of the RC network of capacitor 56 and resistor 58 is relatively large. This measurement of deflection coil current minimizes any change in the peak deflection coil current as given in equation (1).

An output from the buffer amplifier 60 is applied to a peak detector comprising a diode 62 and a storage capacitor 64. Again the voltage stored across the capacitor 64 is essentially a DC voltage having a value directly related to the peak current in the deflection coil 10. This voltage is applied through a buffer amplifier 66 to a summing junction 68 through a resistor 70.

At the summing junction 68 there is developed a reference voltage related to the desired peak value of the deflection coil current. This reference voltage is established by a resistor 72 in series with a resistor 74, the latter connected to a conventional reference voltage supply. Any error signal generated at the summing junction 68 is applied to the input of a control amplifier 76 that produces a control voltage to the base electrode of a regulating transistor 78 having an emitter-collector junction in series with the resistor 54. Again, the collector junction of the transistor 78 is connected to an unregulated voltage supply.

In operation, the circuit of FIG. 3 operates essentially as that of FIG. 1. Actual current in the deflecton coil 10 is sensed and any variation thereof from a desired peak value changes the control voltage to the regulating transistor 78 to return the deflection coil current peak value to the desired level. Thus, the horizontal width of an image on a cathode ray tube is maintained constant by regulating the deflection coil current.

While several embodiments of the invention, together with modifications thereof, have been described in detail herein and shown in the accompanying drawings, it will be evident that various further modifications are possible without departing from the scope of the invention.

What is claimed is:

1. A circuit for regulating the current through an inductor, comprising:
   means responsive to the current in the inductor and generating a DC voltage varying therewith,
   a voltage comparator receiving the DC voltage and including a reference voltage source, said comparator generating a control voltage varying with the difference between the DC voltage and the reference voltage, and
   regulating means responsive to the control voltage and connected between a DC voltage source and the inductor to regulate the current through said inductor in accordance with the control voltage.

2. A circuit for regulating the current through an inductor as set forth in claim 1 wherein said means responsive to the current includes means for converting the current in the inductor into a voltage related thereto.

3. A circuit for regulating the current through an inductor as set forth in claim 1 wherein said means responsive to the current includes means for converting a current varying plus and minus of zero into a DC voltage.

4. A circuit for regulating the current through an inductor as set forth in claim 1 wherein said means responsive to the current includes a resistor in series with the inductor for generating a voltage varying with inductor current.

5. A circuit for regulating the current through an inductor as set forth in claim 4 wherein said means responsive to the current further includes means for converting a voltage across said resistor varying plus or minus of zero into a DC voltage.

6. A current regulating control circuit for the magnetic deflection system of a video display, comprising:
   sensor means responsive to the current in the magnetic deflection system and producing an output voltage varying therewith,
   a peak detector connected to receive the voltage at the output of said sensor means and storing a DC voltage related to the peak values at the output of said sensor means,
   a voltage comparator receiving the peak values of the DC voltage and including a reference voltage source, said comparator generating a control voltage varying with the difference between the peak values of the DC voltage and the reference voltage, and
   regulating means responsive to the control voltage and connected between a DC voltage source and the magnetic deflection system to regulate the current through said system in accordance with the control voltage.

7. A current regulating control circuit as set forth in claim 6 wherein said peak detector includes a diode connected to receive the voltage at the output of said sensor means, and a capacitor connected to said diode for storing the peak values of the DC voltage.

8. A current regulating control circuit as set forth in claim 7 wherein said sensor means includes means for converting the current in the magnetic deflection system into an output voltage varying plus and minus of zero applied to said diode.

9. A current regulating control circuit as set forth in claim 8 wherein said converter includes a resistor in series with the magnetic deflection system.

10. A current regulating control circuit as set forth in claim 6 wherein said sensor means includes a buffer amplifier for isolating the magnetic deflection system from said peak detector.

11. A magnetic deflection circuit for the cathode ray tube of a video display having a deflection coil in series with a charging capacitor and a switching device responsive to an external signal, comprising:
   detector means responsive to the current in the deflection coil and generating a DC voltage varying with the peak values thereof,
   a voltage comparator receiving the peak values of the DC voltage and including a reference voltage source, said comparator generating a control voltage varying with the difference between the peak values of the DC voltage and the reference voltage, and
   control means responsive to the control voltage and connected between a DC voltage source and the deflection coil to regulate the current through said coil.

12. A magnetic deflection circuit as set forth in claim 11 wherein said detector means includes means for converting the current in the deflection coil into a voltage varying plus and minus of zero.

13. A magnetic deflection circuit as set forth in claim 12 wherein said detector means further includes a diode connected to receive the voltage varying plus and minus of zero and generating a DC voltage, and a capacitor for storing the peak values of the DC voltage.

14. A magnetic deflection circuit as set forth in claim 13 including an isolation amplifier connected between said means for converting and said diode.

15. A magnetic deflection circuit as set forth in claim 11 wherein said voltage comparator includes a differential amplifier having one terminal connected to the DC voltage and the reference voltage source.

16. A magnetic deflection circuit as set forth in claim 15 wherein said reference voltage source includes series resistors having an interconnection tied to said detector means.

17. A magnetic deflection circuit as set forth in claim 11 wherein said control means includes a transistor having a collector-emitter junction in series with the deflection coil and having a base electrode connected to receive said control voltage.

18. A circuit for regulating the current through an inductor, comprising:
means responsive to the flyback voltage across the inductor and generating a DC voltage varying therewith,
a voltage comparator receiving the DC voltage and including a reference voltage source, said comparator generating a control voltage varying with the difference between the DC voltage and the reference voltage, and
regulating means responsive to the control voltage and connected between a DC voltage source and the inductor to regulate the current through said inductor in accordance with the control voltage.

19. A circuit for regulating the current through an inductor as set forth in claim 18 wherein said means responsive to the flyback voltage includes means for converting the flyback voltage across the inductor into a voltage related thereto.

20. A circuit for regulating the current through an inductor as set forth in claim 18 wherein said means responsive to the flyback voltage includes means for converting a flyback voltage varying plus and minus of zero into a DC voltage.

* * * * *